United States Patent
Kurts et al.

(10) Patent No.: US 7,504,856 B2
(45) Date of Patent: Mar. 17, 2009

(54) PROGRAMMING SEMICONDUCTOR DIES FOR PIN MAP COMPATIBILITY

(75) Inventors: Tsvika Kurts, Haifa (IL); Alex Waizman, Portland, OR (US); Marcelo Yuffe, Binyamina (IL); Ziv Shmuely, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/744,900

(22) Filed: May 7, 2007

(65) Prior Publication Data

US 2007/0285123 A1      Dec. 13, 2007

Related U.S. Application Data

(63) Continuation of application No. 10/848,395, filed on May 18, 2004, now Pat. No. 7,230,450.

(51) Int. Cl.
*H03K 19/173* (2006.01)
(52) U.S. Cl. .............................. 326/38; 326/41; 326/47
(58) Field of Classification Search .................... 326/38, 326/41, 47
See application file for complete search history.

(56) References Cited

U.S. PATENT DOCUMENTS

| 4,680,491 | A | 7/1987 | Yokouchi et al. |
| 6,417,695 | B1 | 7/2002 | Duesman |
| 6,456,099 | B1 * | 9/2002 | Eldridge et al. ............. 324/754 |
| 6,667,895 | B2 | 12/2003 | Jang et al. |
| 7,230,450 | B2 | 6/2007 | Kurts et al. |

* cited by examiner

*Primary Examiner*—Vibol Tan
(74) *Attorney, Agent, or Firm*—Kacvinsky LLC

(57) ABSTRACT

Methods and systems provide for a semiconductor die that is compatible with a wide variety of industry standard sockets, where each type of socket is identified by a different pin map. In one embodiment, the die has a plurality of signal lines, one or more surface contacts and one or more signal selectors coupled to the signal lines and the surface contacts. Each signal selector electrically connects one of the signal lines to one of the surface contacts based on a programming signal. In a particularl embodiment, each signal selector includes a multiplexer and a fuse element, where the multiplexer routes one of its input ports to its output port based on a programming value of the fuse element. The programming value can be set by the programming signal.

27 Claims, 3 Drawing Sheets

| bump# | Socket #1 | Socket #2 | Socket #3 | Socket #4 |
|---|---|---|---|---|
| 7 | S1 | S1 | S6 | S1 |
| 8 | S2 | S2 | S7 | S11 |
| 9 | S3 | S3 | S8 | S12 |
| 327 | S4 | S4 | S9 | S5 |
| 333 | S5 | S5 | S10 | S13 |

US 7,504,856 B2

PROGRAMMING SEMICONDUCTOR DIES FOR PIN MAP COMPATIBILITY

CROSS REFERENCE TO RELATED APPLICATION

This application is a continuation of U.S. patent application Ser. No. 10/848,395, which was filed on May 18, 2004.

BACKGROUND

1. Technical Field

One or more embodiments of the present invention generally relate to semiconductor design. In particular, certain embodiments relate to the programming of semiconductor dies.

2. Discussion

Modern day computer systems have various circuit boards with sockets designed to receive computing components such as processor integrated circuit (IC) chips, memory chips, etc. A memory chip and/or a processor IC chip may include various types of memory, such as read-only memory (ROM), random-access memory (RAM), dynamic RAM (DRAM), Double-Data-Rate DRAM (DDRAM), synchronous DRAM (SDRAM), static RAM (SRAM), programmable ROM (PROM), erasable programmable ROM (EPROM), electrically erasable programmable ROM (EEPROM), flash memory, polymer memory such as ferroelectric polymer memory, ovonic memory, phase change or ferroelectric memory, silicon-oxide-nitride-oxide-silicon (SONOS) memory, or any other type of media suitable for storing information. Each circuit board/socket is typically associated with a pin map, which defines the expected signals to be transmitted on the pins that connect the chip in question to the circuit board. For example, a conventional pin map might assign signal A to pin #1, signal B to pin #2, and so on. The chips often have a semiconductor die with signal lines that carry the particular signals, where each signal line is routed within the die to a surface contact such as an electrically conductive bump, and the bumps are bonded to an interface (or "package"). The package routes the signals to various pins according to an order defined by an industry standard socket.

As the product life cycle of a given computer system configuration comes to an end or transitions to a different market segment, it may be replaced by a computer system having circuit boards with one or more different sockets and/or pin maps. The semiconductor dies (and bump configurations) to be plugged into the modified sockets, however, may be the same. Accordingly, each package is typically redesigned to provide the necessary routing between the bumps and pins and is therefore dedicated to a particular pin map.

An example of such an approach is shown in FIG. 1. In the illustrated example, a semiconductor die 10 has a plurality of signal lines 12 (12a-12b) electrically connected to a corresponding plurality of electrically conductive bumps 14 (14a-14b), which are an integral part of the die 10. A semiconductor package 16 is used to route the signals to pins 18 (18a-18b), where the pins 18 connect to a motherboard 20 through a socket 22. It can be seen that depending upon the pin map associated with the socket 22 and/or motherboard 20, the routing within the package 16 can potentially be rather complex. As a result, it is not uncommon for semiconductor packages such as the package 16 to have a multilayer routing configuration, which adds to the cost of the overall package 16. Furthermore, routing signals for relatively long distances can cause impedance mismatching and therefore negatively impact signal integrity. Indeed, it has been determined that the deterioration in signal integrity for certain high speed signals is such that multilayer routing cannot be used. The conventional solution has often been to limit the maximum core frequency of the die in order to minimize the effects of traditional packaging techniques. The result can be a significant decrease in performance.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Figure 1:
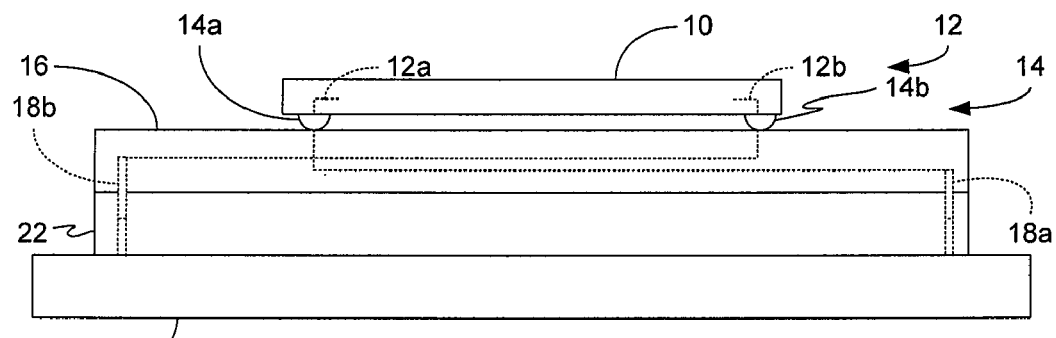
FIG. 1 is a side view of an example of a conventional computer system.
Figure 2:
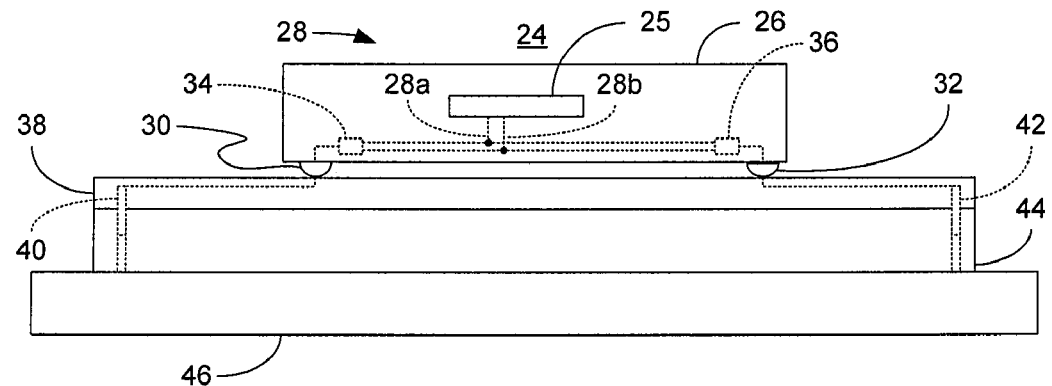
FIG. 2 is a side view of an example of a computer system according to one embodiment of the invention.

FIG. 2 shows a computer system 24 having a semiconductor die 26, a semiconductor package 38 and a circuit board 46 with a socket 44. In one embodiment, the circuit board 46 is a motherboard, where the computer system 24 is part of a desktop personal computer (PC), notebook PC, server, or any other type of system that can benefit from the principles described herein. The reduced form factor of the computer system 24, for example, makes it particularly useful for mobile applications such as notebook PCs. The semiconductor die 26 can include an integrated circuit (IC) with a processor 25 and a plurality of signal lines 28 (28a-28b). The illustrated die also has one or more surface contacts 30, 32, which are integral to the die 26, and one or more signal selectors 34, 36. Each signal selector 34, 36 electrically connects one of the signal lines 28 to one of the surface contacts 30, 32.

In the illustrated example, the signal selector 34 electrically connects either signal line 28a or signal line 28b to the surface contact 30. Similarly, the signal selector 36 electrically connects either signal line 28a or signal line 28b to the surface contact 32. The semiconductor package 38 routes signals between the surface contact 30 and a pin 40 and routes signals between the surface contact 32 and a pin 42. The pins 40, 42 mate with the socket 44, which connects to the circuit board 46. Alternatively, the pins 40, 42 could plug directly into the circuit board 46, where the socket 44 is not used.

By using the signal selectors 34, 36 to establish the desired signal line-to-surface contact pairing, the die 26 provides a number of advantages over conventional approaches. For example, the package 38 can be simplified to obtain more direct single layer routing and lower associated costs. Simplified packaging also reduces manufacturing effort, product development costs and the time to market. Furthermore, the shorter routing distances provide better impedance matching and greater signal integrity. Simply put, signal line-to-surface contact pairing takes place within the semiconductor die 26, whereas conventional approaches provide for surface contact-to-pin pairing within the semiconductor package and require relatively complex bonding and routing configurations.

It should also be noted that the illustrated approach may eliminate the need for a dedicated package for each type of pin map. In particular, the package 38 can be used for a wide variety of socket and/or circuit board configurations. For example, the socket 44 of the illustrated embodiment could call for the signal associated with the signal line 28a to be routed to/from the pin 40, whereas another socket (not shown) could call for the signal associated with the signal line 28a to be routed to/from the pin 42. The semiconductor die 26 can readily accommodate either scenario. The result is a "chameleon" type of semiconductor die 26 that has widespread compatibility. Even in cases where the package 38 may not accommodate a particular socket (e.g., due to platform requirements), substantial advantages could be obtained from the die 26 being compatible with multiple packages.

Although two surface contacts 30, 32 are shown for ease of discussion, the concepts described can be readily expanded to provide for signal selection for all surface contacts on a given die. Thus, a typical implementation can include many more signal selectors, surface contact, pins, etc. In this regard, only the signal lines that are actually required for the pin map need to be routed to/from the surface contacts 30, 32. As a result, the package 38 is further simplified over conventional approaches, which route all signals off of the die before the necessary signals are selected. It should also be noted that the techniques described can also be used for other types of bonding configurations including, but not limited to, "flip chip" or "wire bond" configurations in which the surface contacts 30, 32 are positioned on a top surface of the semiconductor die 26.

Figure 3:
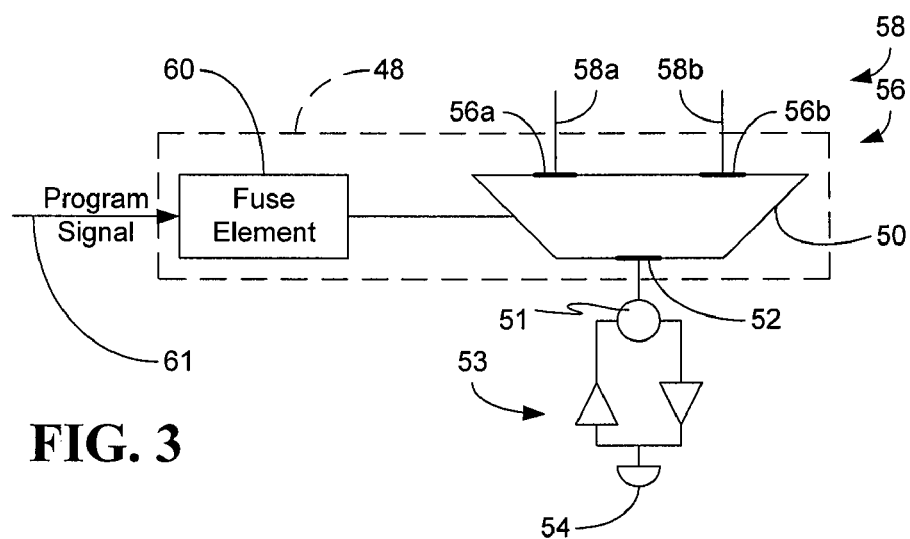
FIG. 3 is a diagram of an example of a first signal selector according to one embodiment of the invention.

FIG. 3 shows one approach to a signal selector 48 in greater detail. Thus, the signal selector 48 can be readily substituted for each of the signal selectors 34, 36 (FIG. 2) discussed above. In particular, the signal selector 48 has a multiplexer 50 with an output port 52 coupled to pad logic 51, where the pad logic 51 is coupled to a surface contact such as an electrically conductive bump 54 through input/output (I/O) buffers 53. The pad logic 51 and I/O buffers 53 provide high-power drive to off-chip loads and protect the internal circuitry from external static discharges. The multiplexer 50 also has a plurality of input ports 56 (56a-56b) coupled to a plurality of signal lines 58 (58a-58b). The term "coupled" is used herein to refer to any type of connection, direct or indirect, that enables communication to take place across the interface in question. Thus, coupling might include intermediate components. The coupling might also provide for electronic, electromagnetic, optic and other forms of communication.

The signal selector 48 also has a fuse or any other type of programming element 60 coupled to the multiplexer 50, where the multiplexer 50 routes one of the input ports 56 to the output port 52 based on a programming value of the fuse element 60. As already noted, the fuse element 60 can be any type of switch capable of being programmed. For example, in the case of two input ports the fuse element 60 could take on a binary value of either high or low, where the value is set by a programming signal 61. The programming signal 61 is typically applied to the fuse element 60 during one of the manufacturing stages of the semiconductor die. In addition, the multiplexer 50 completes the routing before the semiconductor die reaches a specific operational state such as a state of full operation in order to ensure proper operation of the IC on the die.

The illustrated example has been simplified for the purposes of discussion and the multiplexer 50 can select between a greater number of signal lines without parting from the nature and spirit of the embodiments described herein. In such a case, the fuse element 60 could be designed to take on a greater number of values. Alternatively, the fuse element 60 may include a set of fuses. Such an approach may be particularly useful where the multiplexer 50 is designed to select between more than two signals. Semiconductor fusing has been used to selectively disable various features on IC chips before shipping and the process is well understood in the art.

It should also be noted that in one approach the fuse element 60 generally has a default value, which is changed upon receipt of the programming signal 61. Thus, if no programming signal 61 is received the fuse element 60 still has a programming value that can be detected or read by the multiplexer 50. Furthermore, the signal selector 48 can operate in a bi-directional manner. Thus, although the terms "input" and "output" have been used to refer to the ports of the multiplexer 50, the multiplexer 50 can readily be used to receive an external signal at port 52 and route it to one of the plurality of signal lines 58 coupled to ports 56.

Figures 4, 5:
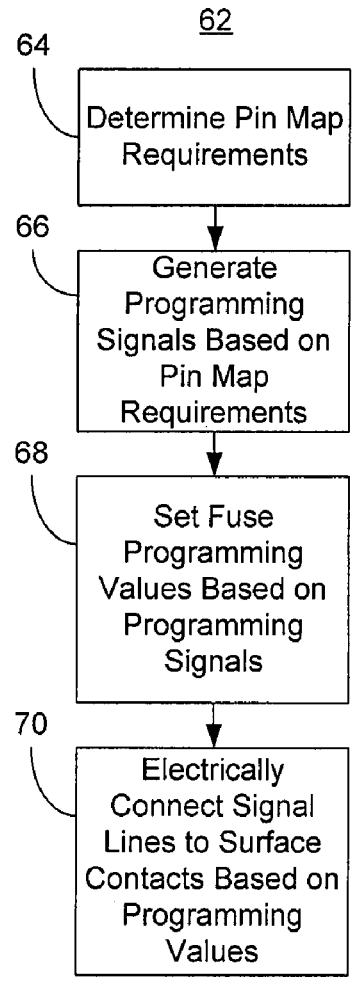
FIG. 4 is a flowchart of an example of a method of programming a semiconductor die according to one embodiment of the invention.
FIG. 5 is a diagram of an example of a signal selection table according to one embodiment of the invention.

Turning now to FIG. 4, a method 62 of programming a semiconductor die is shown. Portions of the method 62 can be implemented as a set of instructions to be stored in a machine readable medium such as read only memory (ROM), random access memory (RAM), flash memory, etc. Portions of the method 62 can also be implemented in a semiconductor die as an application specific integrated circuit (ASIC) using well known hardware techniques. In particular, the illustrated method 62 provides for determining pin map requirements for a given socket and/or circuit board configuration at processing block 64. Programming signals are generated at 66 based on the pin map requirements. Block 68 provides for setting programming values of one or more fuse elements based on the programming signals and block 70 provides for electrically connecting one of a plurality of signal lines to each surface contact of a semiconductor die based on the programming values.

FIG. 5 shows one example of a signal selection table 72 in which die bumps are linked to multiple socket configurations. In particular, the table 72 identifies the appropriate signal line-to-bump pairings for four different socket configurations. From the illustrated example, it can be determined that the signal selector associated with bump #7 can select between two different signals, "S1" and "S6", depending upon the configuration. On the other hand, the signal selector associated with bump #8 selects between three different signals, "S2", "S7" and "S11".

In this regard, it should be noted that typically the signal lines coupled to a given signal selector carry signals that are associated with a fixed I/O buffer type, such as I/O buffer 53, and a common data strobe signal. Although a variable I/O buffer type is possible, it has been determined that a fixed buffer type can provide better alternating current (AC) timing and overall chip I/O performance. Restricting selectable signals to the same type of buffer further enhances the design. For example, signals for bump #7 might all be associated with I/O buffer 53 implemented as a complimentary metal oxide semiconductor (CMOS) type of buffer, whereas the signals for bump #333 might all be associated with I/O buffer 53 implemented as an assisted gunning transistor logic (AGTL+) type of buffer. Such an approach eliminates the need for variable buffer types.

Thus, the data in the table 72 can be used to construct an array of programming signals to be applied to the appropriate fuse elements in order to set the necessary programming values. Depending upon the circumstances, each programming signal can be an individual pulse, a series of pulses or a linear signal. The result is a semiconductor die that can be quickly programmed to be compatible with a wide variety of circuit boards and/or socket configurations. Furthermore, costs and time to market can be significantly reduced without sacrificing signal integrity. Indeed, signal integrity can be enhanced through the techniques described herein to achieve much higher performance for the semiconductor die. For example, maximum processing speeds for the die can be increased without the concern over packaging-related impedance mismatching associated with conventional approaches. Higher processing speeds can translate directly into increased performance.

Figure 6:
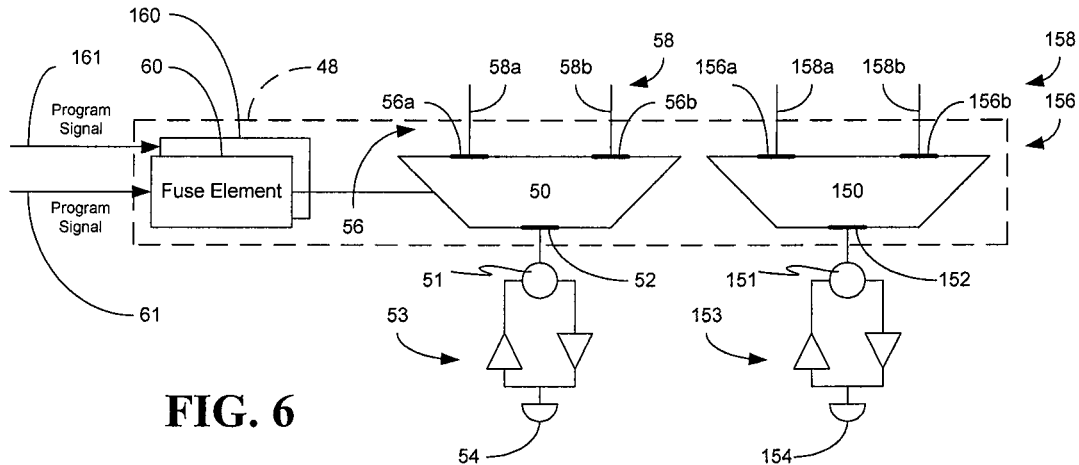
FIG. 6 is a diagram of an example of a second signal selector according to one embodiment of the invention.

FIG. 6 is a diagram of an example of a second signal selector according to one embodiment of the invention. FIG. 6 illustrates signal selector 48 modified to use a plurality of multiplexers corresponding to a plurality of surface contacts, with each multiplexer to route one of a plurality of signal lines to a corresponding surface contact based on a programming value of a fuse element. FIG. 6 illustrates signal selector 48 with elements 50, 51, 52, 53, 54, 56, 58, 60 and 61 as described with reference to FIG. 3. In addition, FIG. 6 illustrates signal selector 48 with additional elements 150, 151, 152, 153, 154, 156, 158, 160 and 161, that are the same or similar to corresponding elements 50, 51, 52, 53, 54, 56, 58, 60 and 61 as described with reference to FIG. 3. In this manner, signal selector 48 may be arranged with multiple multiplexers to route different signal lines to different surface contacts as desired for a given implementation.

Those skilled in the art can appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

What is claimed is:

1. A semiconductor die comprising:
    a plurality of signal lines;
    two or more surface contacts; and
    two or more signal selectors, each coupled to the signal lines and a respective one of the two or more surface contacts, wherein each of the signal selectors is to electrically connect one of the signal lines to the respective surface contact based on a programming signal.

2. The die of claim 1, wherein each of the signal selectors includes:
    a multiplexer having an output port coupled the respective surface contact and a plurality of input ports coupled to the plurality of signal lines; and
    a fuse element coupled to the multiplexer, the multiplexer to route one of the plurality of input ports to the output port based on a programming value of the fuse element.

3. The die of claim 2, wherein each of the signal selectors is to set the programming value based on the programming signal.

4. The die of claim 3, wherein the multiplexer is to route one of the plurality of input ports before the die reaches an operational state.

5. The die of claim 2, further including pad logic and an input/output (I/O) buffer disposed between the multiplexer and the respective surface contact, the I/O buffer having a fixed buffer type.

6. The die of claim 5, wherein the fixed buffer type is a complimentary metal oxide semiconductor (CMOS) buffer type.

7. The die of claim 5, wherein the fixed buffer type is an assisted gunning transistor logic (AGTL+) buffer type.

8. The die of claim 2, wherein the signal lines are to carry signals associated with a common data strobe signal.

9. The die of claim 1, wherein the surface contacts are electrically conductive bumps.

10. The die of claim 1, further including a processor, the processor being coupled to the signal lines.

11. A system comprising:
    a motherboard;
    a semiconductor die having a plurality of signal lines and two or more surface contacts; and
    a semiconductor package having two or more pins, each pin having a first end coupled to the motherboard and a second end coupled to a respective one of the surface contacts, the semiconductor package further having two or more signal selectors, each signal selector coupled to the signal lines and a respective one of the two or more surface contacts, wherein each of the signal selectors is to electrically connect one of the signal lines to the respective surface contact based on a programming signal.

12. The system of claim 1, wherein each of the signal selectors includes:
    a multiplexer having an output port coupled to the respective surface contact and a plurality of input ports coupled to the plurality of signal lines; and
    a fuse element coupled to the multiplexer, the multiplexer to route one of the plurality of input ports to the output port based on a programming value of the fuse element.

13. The system of claim 12, wherein each of the signal selectors is to set the programming value based on a programming signal.

14. The system of claim 13, wherein the multiplexer is to route one of the plurality of input ports before the die reaches an operational state.

15. The system of claim 12, wherein the die further includes pad logic and an input/output (I/O) buffer disposed between the multiplexer and the respective surface contact, the I/O buffer having a fixed buffer type.

16. The system of claim 15, wherein the fixed buffer type is a complimentary metal oxide semiconductor (CMOS) buffer type.

17. The system of claim 15, wherein the fixed buffer type is an assisted gunning transistor logic (AGTL+) buffer type.

18. The system of claim 12, wherein the signal lines are to carry signals associated with a common data strobe signal.

19. The system of claim 11, wherein the surface contacts are electrically conductive bumps.

20. The system of claim 11, wherein the die further includes a processor, the processor being coupled to the signal lines.

21. A method comprising:
    setting programming values of first and second fuse elements based on corresponding programming signals; and
    based on the programming values, electrically connecting a first of a plurality signal lines to a first surface contact of a semiconductor die and a second of the plurality of signal lines to a second surface contact of the semiconductor die.

22. The method of claim 21, wherein the connecting includes routing one of a plurality of multiplexer input ports to a multiplexer output port based on one of the programming values, the multiplexer output port being coupled to one of the surface contacts and the plurality of multiplexer input ports being coupled to the plurality of signal lines.

23. The method of claim 21, wherein the routing is performed before the die reaches an operational state.

24. A semiconductor die comprising:
a processor having a plurality of signal lines to carry signals associated with a common data strobe signal;
first and second electrically conductive bumps;
first and second input/output (I/O) buffers, the first I/O buffer coupled to the first electrically conductive bump and the second I/O buffer coupled to the second electrically conductive bump, wherein the first and second I/O buffers have a fixed buffer type;
first and second pad logic coupled to the first and second I/O buffers, respectively; and
first and second signal selectors, the first signal selector coupled to the signal lines and the first pad logic and the second signal selector coupled to the signal lines and the second pad logic;
wherein the first signal selector is to electrically connect one of the signal lines to the first bump, and the second signal selector is to electrically connect one of the signal lines to the second bump; and
wherein each of the first and second signal selectors includes a multiplexer and a fuse element coupled to the multiplexer, the multiplexer having an output port coupled to the corresponding pad logic and a plurality of input ports coupled to the plurality of signal lines, the multiplexer to route one of the plurality of input ports to the output port based on a programming value of the fuse element before the die reaches an operational state, the programming value to be based on a programming signal.

25. The die of claim 24, wherein the fixed buffer type is a complimentary metal oxide semiconductor (CMOS) buffer type.

26. The die of claim 24, wherein the fixed buffer type is an assisted gunning transistor logic (AGTL+) buffer type.

27. The method of claim 21, further including generating the programming signal based on a pin map associated with a circuit board.

* * * * *

UNITED STATES PATENT AND TRADEMARK OFFICE
CERTIFICATE OF CORRECTION

PATENT NO. : 7,504,856 B2  Page 1 of 1
APPLICATION NO. : 11/744900
DATED : March 17, 2009
INVENTOR(S) : Kurts et al.

It is certified that error appears in the above-identified patent and that said Letters Patent is hereby corrected as shown below:

On the Title page, in field (57), under "Abstract", in column 2, line 9, delete "particularl" and insert -- particular --, therefor.

In column 1, line 8, after "2004." insert -- now U.S. Patent No. 7,230,450. --.

In column 5, line 49, in Claim 2, after "coupled" insert -- to --.

In column 6, line 23, in Claim 12, delete "1," and insert -- 11, --, therefor.

In column 6, line 58, in Claim 21, delete "plurality signal" and insert -- plurality of signal --, therefor.

Signed and Sealed this

Twenty-third Day of February, 2010

David J. Kappos
*Director of the United States Patent and Trademark Office*